United States Patent [19]

Edson et al.

[11] 4,327,371
[45] Apr. 27, 1982

[54] METHOD AND APPARATUS CALIBRATING A PLURALITY OF PREAMPLIFIERS

[75] Inventors: Alvin W. Edson, Binghamton; Richard A. Windyka, Chenango Bridge, both of N.Y.

[73] Assignee: The Singer Company, Binghamton, N.Y.

[21] Appl. No.: 105,067

[22] Filed: Dec. 19, 1979

[51] Int. Cl.³ .............................................. H04N 9/62
[52] U.S. Cl. ....................................... 358/10; 358/139
[58] Field of Search ................. 358/10, 139, 174, 184, 358/160, 212

[56] References Cited

FOREIGN PATENT DOCUMENTS 1504482  3/1978  United Kingdom .
1568381  5/1980  United Kingdom .

Primary Examiner—Richard Murray
Attorney, Agent, or Firm—Stephen C. Kaufman

[57] ABSTRACT

A method and apparatus for quickly and easily calibrating a relatively unstable light detector, such as a photomultiplier tube. The system is particularly designed to effect large scale semi-automatic calibration of many photomultiplier tube-preamplifier combinations that may exist in, for example, a laser scanner system. Each preamplifier (10) includes an automatic gain control circuit (20) connected in a loop which is momentarily closed during a calibrate mode when a predetermined level of a calibrated light source (15) is directed upon the associated tube (12). An error amplifier (34) develops a voltage in accordance with the deviation of the video output of the tube from the expected level during calibration, and the error voltage is preferably stored in digital form (38) so that the gain of the preamplifier (10) may be maintained at the calibrated level between successive calibrations. The calibrated light source (15) is chopped to provide alternating bright cycles and dark cycles during the calibration mode. The preamplifiers are calibrated during the bright cycles, while the dark cycles are utilized to restore the direct current level of the video output signal, which restoration occurs in normal operation during horizontal blanking of the video system.

30 Claims, 7 Drawing Figures

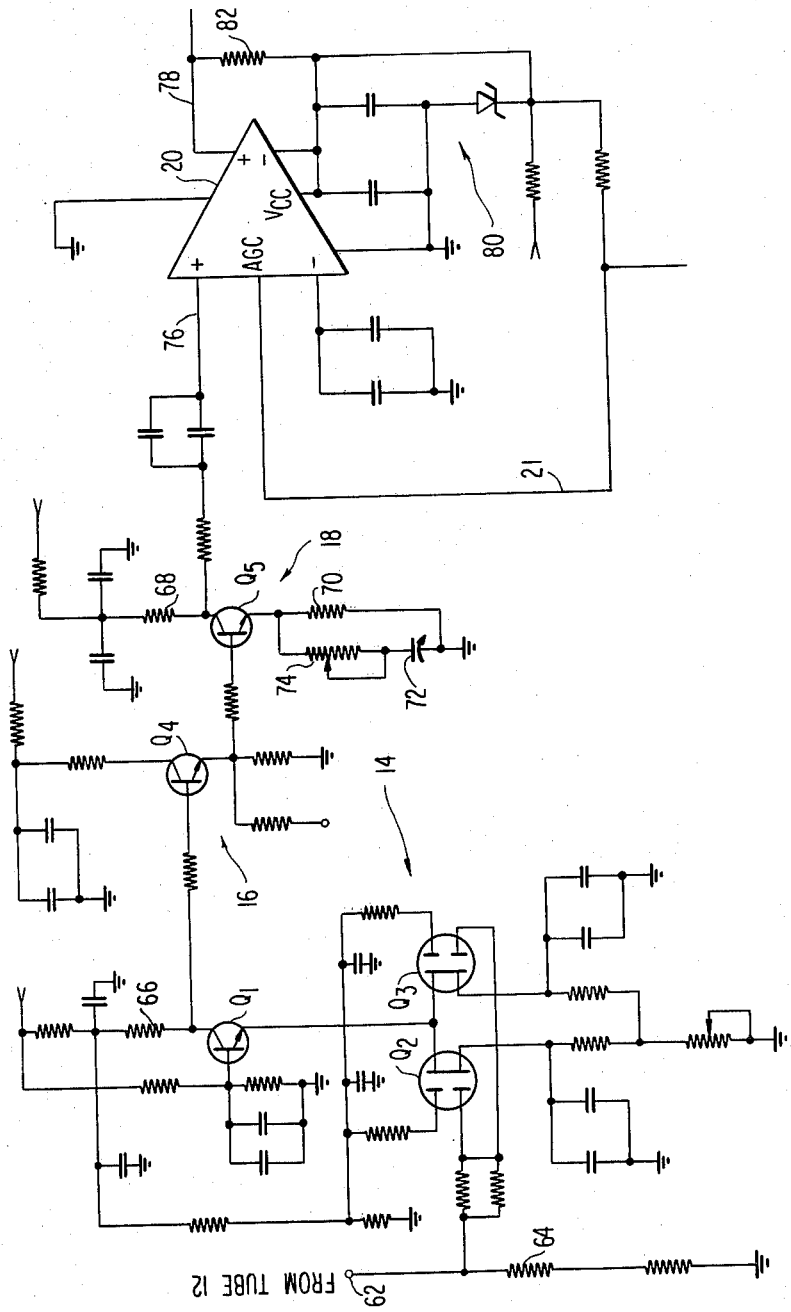

METHOD AND APPARATUS CALIBRATING A PLURALITY OF PREAMPLIFIERS

BACKGROUND OF THE INVENTION

1. Field of the Invention

The present invention relates to gain calibration methods and devices and, more particularly, is directed towards a method and apparatus for easily and quickly calibrating the gain of one or a plurality of photomultiplier tube-preamplifier combinations.

2. Description of the Prior Art

Certain video systems are known which employ a light source, such as a laser, to scan and therefore illuminate an object or scene desired to be displayed. The light which is scattered from the scene is detected by a plurality of light detectors, such as photomultiplier tubes, which are normally arranged in triads, one for each primary color. Since the light is scattered, the outputs from the photomultiplier tubes must be summed, from which the image may be reconstructed in the three primary colors.

Each photomultiplier tube has a relatively low level output which must be raised to system video levels (for example, one volt peak-to-peak). This must be accomplished with very low noise and a wide, uniform bandwidth of, for example, 0–40 megahertz. To accomplish these functions, associated with each photomultiplier tube is a preamplifier connected to receive the output signal of the tube and amplify it in accordance with these desired characteristics.

Since photomultiplier tubes exhibit relatively poor gain stability, they must be frequently calibrated in order to insure a uniform output from day-to-day throughout the system.

Known methods utilized to control gain in a preamplifier include the use of a motor-driven potentiometer or an automatic gain control circuit in an open loop configuration. Such techniques require manual calibration of gain and are relatively tedious and time consuming. As a result, readiness maintenance of the preamplifier is infrequently performed, and gain accuracy leaves much to be desired, especially when the preamplifier is connected to a signal source such as a photomultiplier tube. Another technique utilized to adjust the gain of a photomultiplier tube is to vary the high voltage to its dynode divider string. This has been accomplished by using a servo control and a suitable reference. Such a technique is acceptable, however, only when a relatively small number of photomultiplier tube-preamplifiers are involved. In a laser scanner system, as described above, a large number of preamplifiers are involved, and such techniques become extremely cumbersome.

The following U.S. patents relating to this general area of technology are known: U.S. Pat. Nos. 3,900,731; 4,036,763, and 4,127,813.

OBJECTS OF THE INVENTION

It is therefore a primary object of the present invention to provide a method and apparatus for calibrating the gain of a photomultiplier tube-preamplifier combination which overcomes the deficiencies noted above with respect to prior art techniques.

Another object of the present invention is to provide a method and apparatus for quickly and semi-automatically calibrating a large number of preamplifiers each of which are connected to process the outputs from respective gain-unstable light detectors, such as photomultiplier tubes.

Another object of the present invention is to provide a method and apparatus for accurately gain calibrating a plurality of photomultiplier tube-preamplifier combinations, each of which has the ability to store the results of the individual calibration until the next calibration is performed.

A further object of the present invention is to provide a calibration process for a photomultiplier tube-preamplifier combination which permits large numbers of such combinations to be automatically calibrated as frequently as may be desired to achieve and maintain high system accuracy.

A still further object of the present invention is to provide a calibration technique and apparatus for a preamplifier in a video system which also enables calibration of dark signal reference levels, both during normal operation and during calibration.

Another object of the present invention is to provide a video imaging system comprised of a plurality of sets of light detectors, such as photomultiplier tubes, and associated preamplifiers wherein the gain of each tube-preamplifier combination may be easily and quickly calibrated, and wherein an output indication may be provided to indicate a weak or defective light detector requiring replacement.

SUMMARY OF THE INVENTION

The foregoing and other objects are attained in accordance with one aspect of the present invention through the provision of a video imaging system which comprises a plurality of light detectors, such as photomultiplier tubes, a plurality of preamplifiers operable in either a normal mode or a calibrate mode and connected respectively to receive the outputs from the detectors, a plurality of means associated respectively with the plurality of preamplifiers for individually calibrating the gain thereof during the calibrate mode, and control means for synchronizing the operation of the plurality of individual gain calibrating means with the video system.

In accordance with more specific aspects of the present invention, each of the preamplifiers preferably includes automatic gain control circuit means responsive to an analog control voltage for adjusting the gain thereof, while each of the gain calibrating means include means for generating the analog control voltage in response to a predetermined level of light directed onto its associated detector. Each of the gain calibrating means further comprises means for comparing the output of its associated detector in response to the predetermined level of light with a preset reference voltage and for generating an error voltage that is proportional to the difference therebetween, and means for storing the error voltage. Means are also preferably provided which are connected to receive the error voltage from the comparing means and for converting the error voltage into a digital signal, means for transferring the digital signal to the storing means, and means for converting the digital signal in the storing means into the analog control signal for the automatic gain control circuit means.

In accordance with other specific aspects of the present invention, the control means preferably comprises a chopped light source directed onto the plurality of light detectors during the calibrate mode, and means for sensing the output of the light source to provide an indication of the bright cycles and dark cycles thereof. The control means further includes means for detecting when the preamplifiers are in the normal mode or the calibrate mode, and means for synchronizing the sensing means and the detecting means with the horizontal drive pulses of the video system. Means are also provided which are responsive to the synchronizing means for restoring the direct current level of the output signals from the preamplifiers during horizontal blanking while in the normal mode and during the dark cycles while in the calibrate mode. Means are provided which are further responsive to the synchronizing means for initiating the generation of the analog control voltage during the bright cycles.

In accordance with another aspect of the present invention, there is provided a method of calibrating a preamplifier which is connected to receive the output of a photomultiplier tube or the like, the preamplifier including an automatic gain control circuit whose gain is adjusted by an analog control voltage, which comprises the steps of directing a chopped source of calibrated light onto the tube in a calibrate mode to create alternating bright cycles and dark cycles, comparing the output voltage of the preamplifier during one of the bright cycles with a predetermined voltage level and generating an error voltage in proportion to the difference therebetween, and developing the analog control voltage in response to the error voltage for adjusting the gain of the automatic gain control circuit. The step of developing the analog control voltage preferably includes the steps of converting the error voltage into a digital signal, storing the digital signal in a memory at the conclusion of the preceding step, and converting the stored digital signal into the analog control voltage. The method further preferably comprises the step of restoring a direct current voltage level to the output of the preamplifier during the dark cycles.

In accordance with yet another aspect of the present invention, there is provided a preamplifier which is connected to receive the video output signal of a tube in a video imaging system, which comprises automatic gain control circuit means for amplifying the video output signal in accordance with an analog control signal received by the automatic gain control circuit means, and means operative in a calibrate mode for generating and storing a digital signal proportional to the analog control signal in response to a calibrated source of light impinging on the tube.

In accordance with more specific aspects, the preamplifier further includes means operative during a normal mode and during the calibrate mode for periodically restoring a direct current level to the video output signal in response to a clamp key signal, means for chopping the calibrated source of light prior to impinging on the tube for providing alternating bright cycles and dark cycles of video output, the generating and storing means being enabled only during the bright cycles, and means for generating the clamp key signal during horizontal blanking of the video system in the normal mode and during the dark cycles in the calibrate mode.

In accordance with another aspect of the present invention, means are provided for inhibiting the generation of the clamp key signals during the bright cycles in the calibrate mode, which comprises integrator means responsive to the calibrated source of light for developing a waveform having alternating portions corresponding to the bright cycles and the dark cycles, first one-shot means responsive to the transition from a dark cycle to a bright cycle of the waveform for generating a bright pulse that falls solely within the bright cycles, second one-shot means responsive to the transition from the bright cycle to the dark cycle of the waveform for generating a dark pulse that falls solely within the dark cycles, first bistable means responsive to a transition from the normal mode to the calibrate mode and to the conclusion of the bright pulse for generating a first enabling output signal, second bistable means responsive to the first enabling output signal and the initiation of the dark pulse for providing a second enabling output signal, gate means responsive to the second enabling output signal and the dark pulse for providing a third enabling output signal, and clamp key shaping and generating means responsive to the horizontal drive signal and the third enabling output signal for generating the clamp key signal only during the dark cycles.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIGS. 2a, 2b and 2c are schematic circuit diagrams which together illustrate a preferred embodiment of the preamplifier of FIG. 1;

DETAILED DESCRIPTION OF THE PREFERRED EMBODIMENTS

The present invention, in a broad sense, comprises a method and apparatus for calibrating a light detector, such as a photomultiplier tube, whose output is coupled to a preamplifier stage. Moreover, in a preferred embodiment, the present invention is designed to enable calibration of a large number of such tube-preamplifier combinations which are utilized, for example, in a laser scanning system. Although the present invention will, for the sake of simplicity and clarity, be described within the context of such a laser scanning system, it will be apparent to one of ordinary skill in the art that the invention is not limited to use with such systems.

As mentioned above, photomultiplier tubes are utilized in a laser scanner to sense the light reflected from the objects or scenes being illuminated by the laser. In a typical laser scanning system, at least 216 such photomultiplier tubes are utilized: 72 of which are for red video, 72 of which are for green video, and 72 of which are for blue video. Additional photomultiplier tubes may be provided for fill-in lighting, cultural lighting, and other light illumination effects, depending upon the particular application.

Figure 1:
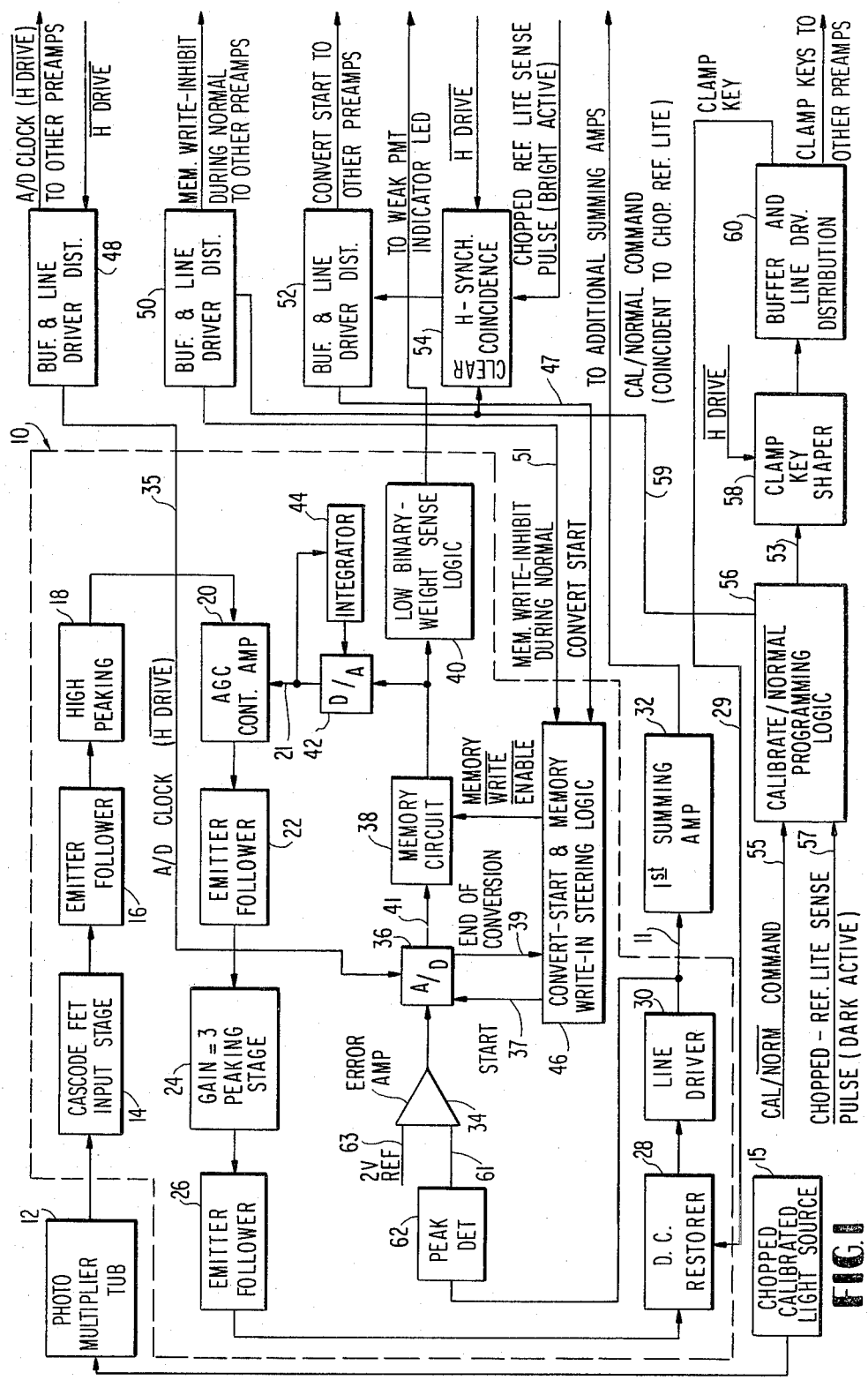
FIG. 1 is a block diagram of a preferred embodiment of the apparatus of the present invention.

Referring now to FIG. 1, one such photomultiplier tube is indicated by reference numeral 12. Connected to receive the output from tube 12 is a preamplifier 10 which is indicated in dotted outline. Each tube 12 has a substantially identical preamplifier 10 associated therewith, and the outputs of all preamplifiers in the system are combined in suitable summers to obtain the desired red-green-blue video output signal, as well as the special video output signals such as cultural lighting or the like. In FIG. 1, the output from preamplifier 10 is on line 11 and is fed to a first summing amplifier 32 and then to additional summing amplifiers for further processing and eventual display.

Block 10 of FIG. 1, in addition to normal preamplifier components designed to amplify the video output from tube 12 with the desired bandwidth and low noise, includes other elements designed to permit the gain of the tube-preamplifier combination to be adjusted as frequently as may be desired. Thus, preamplifier 10 may be operated in one of two modes: "normal" or "calibrate". Calibration is achieved by closing an automatic gain control loop, which includes automatic gain control amplifier 20, onto a calibrated light source 15 which, in a relatively short time, can traverse the entire array of photomultiplier tubes. The invention includes logic circuitry so that the automatic gain control loop will be closed only when the calibrated light source 15 is in position and lined up with a particular photomultiplier tube-preamplifier combination. After the loop is closed, and the calibration is achieved, the loop is then opened so the preamplifier can resume normal operation and so that the next tube-preamplifier combination can be calibrated. The value of the automatic gain control voltage established during the calibration mode is maintained for each tube-preamplifier combination in its own memory circuit which is indicated in FIG. 1 by reference numeral 38. Such storage maintains the gain of the particular tube-preamplifier combination at the value established during the preceding calibration until the time of the next calibration. The calibrations may be performed frequently enough so that there will be no appreciable change of signal gain between successive calibration periods. The present invention automatically compensates for any gain drift in the preamplifier circuitry itself to thereby render the preamplifier very stable. The automatic gain control loop also includes a circuit 40 for sensing the level of the automatic gain control voltage and which activates a warning light in the event that too much gain is required to compensate for a photomultiplier tube that has gone weak in efficiency. The warning light indicates that replacement of that particular tube is in order. The entire calibration operation for each tube-preamplifier combination is controlled and synchronized with the video imaging system.

BLOCK DIAGRAM OF SYSTEM

The anode of photomultiplier tube 12 is coupled directly into a cascode field effect transistor (FET) input stage 14. Stage 14 provides high initial gain to the video output signal with a minimum of noise. An emitter follower 16 buffers the input stage 14 from a high-peaking stage 18, the latter being designed to compensate for the roll-off of high frequencies that results from stray and photomultiplier tube capacitances, and also results in a flat video response of, for example, 40 megahertz.

The high peaking stage 18 is alternating current coupled to the input of an automatic gain control amplifier 20 through which additional flat-response gain is obtained. Automatic gain control amplifier 20 includes an input line 21 which delivers a control voltage to the amplifier 20 for adjusting the gain thereof. As mentioned briefly above, and as will be explained in greater detail hereinafter, the control input 21 forms part of the video output sensing loop so that the video gain of amplifier 20 will be automatically adjusted during the calibration mode to keep the video output of preamplifier 10 constant when a chopped reference light source 15 is directed upon the photomultiplier tube 12.

An emitter follower 22 buffers the output from automatic gain control amplifier 20 and feeds same to a gain-of-three stage 24 which contains some additional peaking. The latter is intended to correct for the high frequency roll-off picked up in the amplifier 20 and in the stage 22.

An emitter follower 26 buffers the output from the gain-of-three stage 24, and presents a low impedance source for a direct current restorer 28. Direct current restorer 28 is designed in normal operation to restore direct current relative to a reference ground in order to provide a dark reference on the video output. This is achieved in the normal mode during the horizontal blanking time of the video signal so that each new scan line will be referenced to ground during the time of the whole line. Circuit 28 also functions during the calibrate mode, in a manner to be described in greater detail below.

The direct current restorer 28 is of the gated clamp type and is triggered by reception of a $\overline{\text{CLAMP KEY}}$ signal on line 29. The $\overline{\text{CLAMP KEY}}$ signal is generated by logic blocks 56, 58 and 60, which are illustrated in greater detail in FIG. 3, and which serve to provide the $\overline{\text{CLAMP KEY}}$ signal to all of the preamplifiers in the system, including preamplifier 10.

Logic circuit 56 receives as one input on line 55 a $\overline{\text{CALIBRATE/NORMAL}}$ command signal which, for example, is in a high logic level when it is desired to place preamplifier 10 in its calibrate mode and which is in a low logic level when it is desired to operate preamplifier 10 in its normal mode. The source of the CALIBRATE/NORMAL command signal may be a manual switch or the like.

Another input to logic circuit 56 on line 57 is phototransistor-sensed pulses from the chopped reference light source 15 which provides a substantially square waveform having alternating bright cycles and dark cycles which correspond to times the shuttered and unshuttered light from the calibrated source traverses the chopper.

One of the outputs 59 from logic circuit 56 provides a signal indicative of whether the selected mode of operation is calibrate or normal. If calibrate, circuit 56 ensures that output 59 has been made coincident with the presence of the sensed pulses from the chopped reference light source on line 57.

The other output 53 from logic circuit 56 is provided to a clamp key shaper circuit 58 which also receives $\overline{\text{H DRIVE}}$ pulses that are derived from the sync generator of the video display. The clamp key shaper 58, during the normal mode delays and reshapes the $\overline{\text{H DRIVE}}$ pulses in such a way that the $\overline{\text{CLAMP KEY}}$ signal is bracketed timewise by horizontal blanking. Thus, the direct current restorer 28 during normal operation of preamplifier 10 is gated during the horizontal blanking time of the video system.

However, during the calibration mode, since the chopping of the calibrated light source is generally asynchronous with the video sync system (the chopper disc is generally driven from the shaft of an alternating current synchronous motor which is non-locked to the video rate), it is undesirable to key the clamp during the periods that the chopped calibration light source is unshuttered. Circuit 58, therefore, also serves to inhibit the $\overline{\text{CLAMP KEY}}$ signal during the time that the chopped reference light source is in its bright cycle. When the chopped reference light source is in its dark cycle, there is no video level and $\overline{\text{CLAMP KEY}}$ pulses are allowed to run during such dark, shuttered-out periods of time to provide the desired direct current restoration. In the calibrate mode, the time period within which the $\overline{\text{CLAMP KEY}}$ signals are inhibited is much larger than the scan line time that exists between pulses in a running train of CLAMP KEY pulses. The time constant of the clamp circuit is long enough, however, that no appreciable droop in video exists as a result of the relatively long periods during which no $\overline{\text{CLAMP KEY}}$ signal is provided.

Returning to the preamplifier 10, the output from the direct current restorer 28 is fed to a video line driver 30 which is preferably in the form of a standard chip having a field effect transistor front end so that its input impedance is extremely high. This satisfies the requirement for direct current restorer 28 to look into a very high impedance and therefore minimize the size of the direct current restorer's coupling capacitor while maintaining minimum droop. Line driver 30 drives a terminated (nominally 75 ohms) coaxial cable 11 which feeds the amplified video signal to the first video summer 32 of the color involved with this particular preamplifier 10.

The video output sensing loop and automatic gain control for preamplifier 10 will now be described. The video output from preamplifier 10 is sensed along line 61 as one input to an error amplifier 34. Applied as another input 63 to error amplifier 34 is a predetermined reference voltage which may be, for example, two volts. The level of this reference voltage has been predetermined in accordance with the expected output signal on line 61 when the calibrated light source is directed onto tube 12. If in fact the reference voltage on line 63 to amplifier 34 equals the voltage on input 61, the output of error amplifier 34 will be zero and no correction to the gain of automatic gain control amplifier 20 will be made.

If, however, the voltage on line 61 is not equal to the reference voltage on line 63, error amplifier 34 delivers an analog output voltage proportional to the difference therebetween. This voltage is fed to the input of an analog-to-digital converter 36 for converting the error voltage into digital form.

The analog-to-digital converter 36 does not, however, begin operation until a $\overline{\text{START}}$ signal is received along line 37 from logic circuit 46. Circuit 46, in turn, must receive an A/D CONVERT START signal along line 47 in order to deliver a $\overline{\text{START}}$ signal along line 37. The A/D CONVERT START signal on line 47 is generated from logic circuits 52 and 54 in such a fashion that the analog-to-digital conversion can commence only during a bright cycle of the chopped reference light source. The details of the circuits 52 and 54 will be set forth more fully below.

Analog-to-digital converter 36 also receives as its clock input the $\overline{\text{H DRIVE}}$ signal from line 35 which is generated from the buffer and line driver distribution circuit 48. At the conclusion of the conversion of the error signal into digital form by converter 36, an $\overline{\text{END OF CONVERSION}}$ signal is delivered to logic circuit 46 along line 39. Circuit 46, in turn, then enables memory circuit 38 to receive the digital information from converter 36 along line 41. The memory circuit 38, which preferably comprises a random-access-memory (RAM), immediately delivers its contents to a digital-to-analog converter 42. Converter 42 reconverts the digital value of the error signal back into analog form for delivery as the analog control signal to amplifier 20 along line 21. The magnitude of the signal on line 21 will determine the gain correction to be made to amplifier 20 to provide the desired video output level on line 11. When this is achieved, the output from error amplifier 34 will be the desired value of zero.

As may be appreciated the automatic gain control loop is not a continuous closed loop. Rather it is being interrupted continuously due to the analog-to-digital conversion in circuit 36 and then the writing of the converted data into memory 38, all of which takes place within the period of a full bright calibration signal to the tube 12. Due to the large gain of the error sensing system, such interruptions will give large, over-correction excursions to the automatic gain control input 21, and severe stepping of the video level will occur on the video output 11. To alleviate this problem, an integrator 44 is connected around the digital-to-analog converter 42. If the error signal is such that a large amount of automatic gain control correction is required to alleviate it, only a small part of this dynamic information will reach the input 21, and only a small incremental correction will be possible with each bright and dark calibration light cycle. Integrator 44 therefore requires many such bright/dark cycles of calibration to correct for a full photomultiplier tube drift.

If too much correction is required for a particular tube-preamplifier, a low binary-weight sense logic circuit 40 detects same by also receiving the output from memory 38 and provides a signal to light up an indicator light that indicates that this particular tube has gone weak and requires replacement.

When calibration is complete, the output voltage of preamplifier 10 on line 11 is stabilized to the desired level set by reference input line 63. The CALIBRATE/$\overline{\text{NORMAL}}$ command is returned to $\overline{\text{NORMAL}}$, and the chopped calibration light source is transported to the next cluster of tubes-preamplifiers to repeat the calibration process. When in the normal mode, memory 38 will be in its storage (READ) state by virtue of a $\overline{\text{WRITE INHIBIT}}$ signal received from buffer 50 along line 51, and the analog-to-digital converter 36 will be prevented from starting further conversions.

The automatic gain control input 21 will thus be held at a constant level corresponding to that which provided the correct gain for the tube 12 and preamplifier 10 to obtain the desired level of video output under calibrated light conditions. It will be held at this level by memory 38 until the next calibration cycle is performed.

Schematic Circuit Diagram Of Preamplifier

Figure 2B:
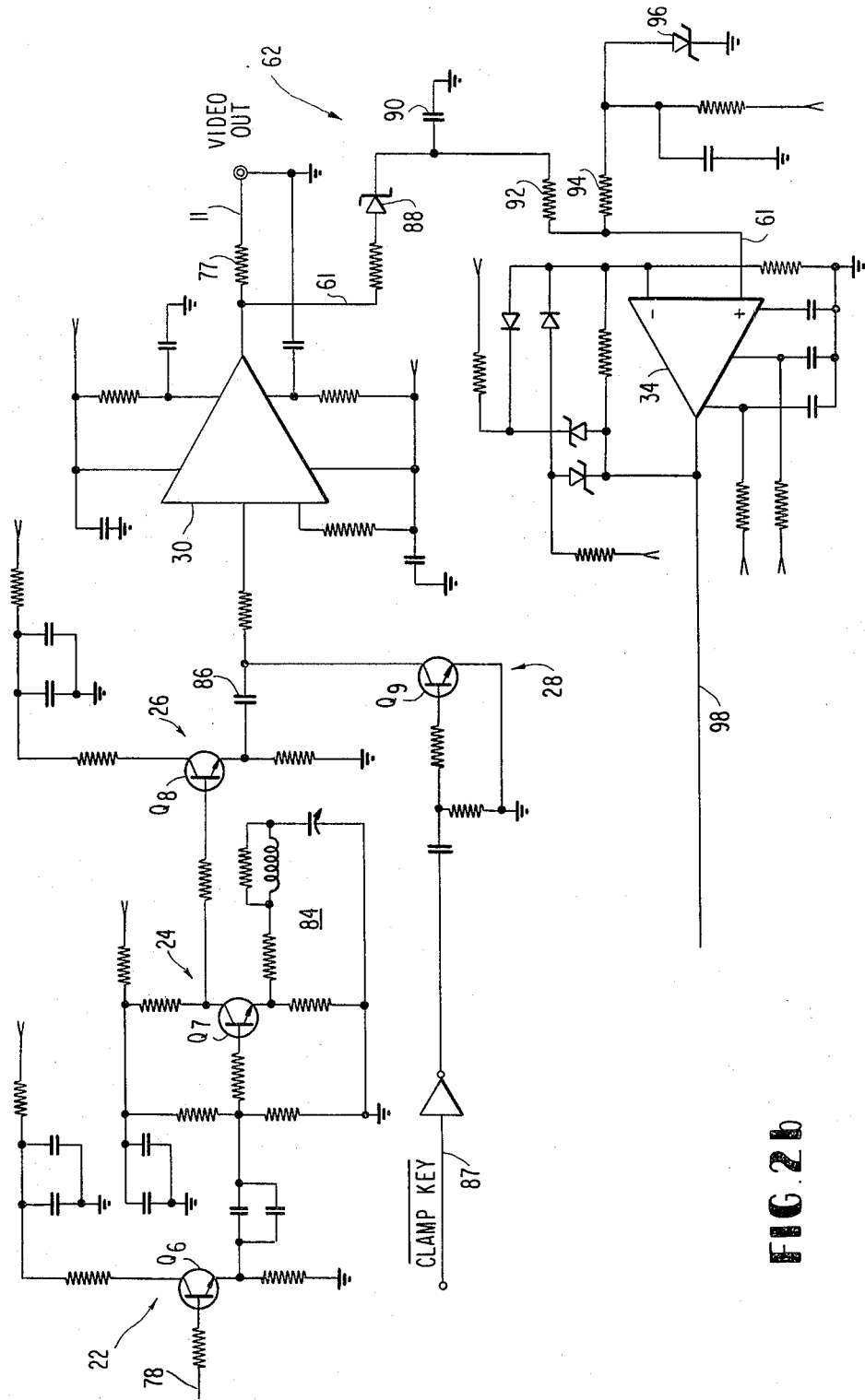
Figure 2C:
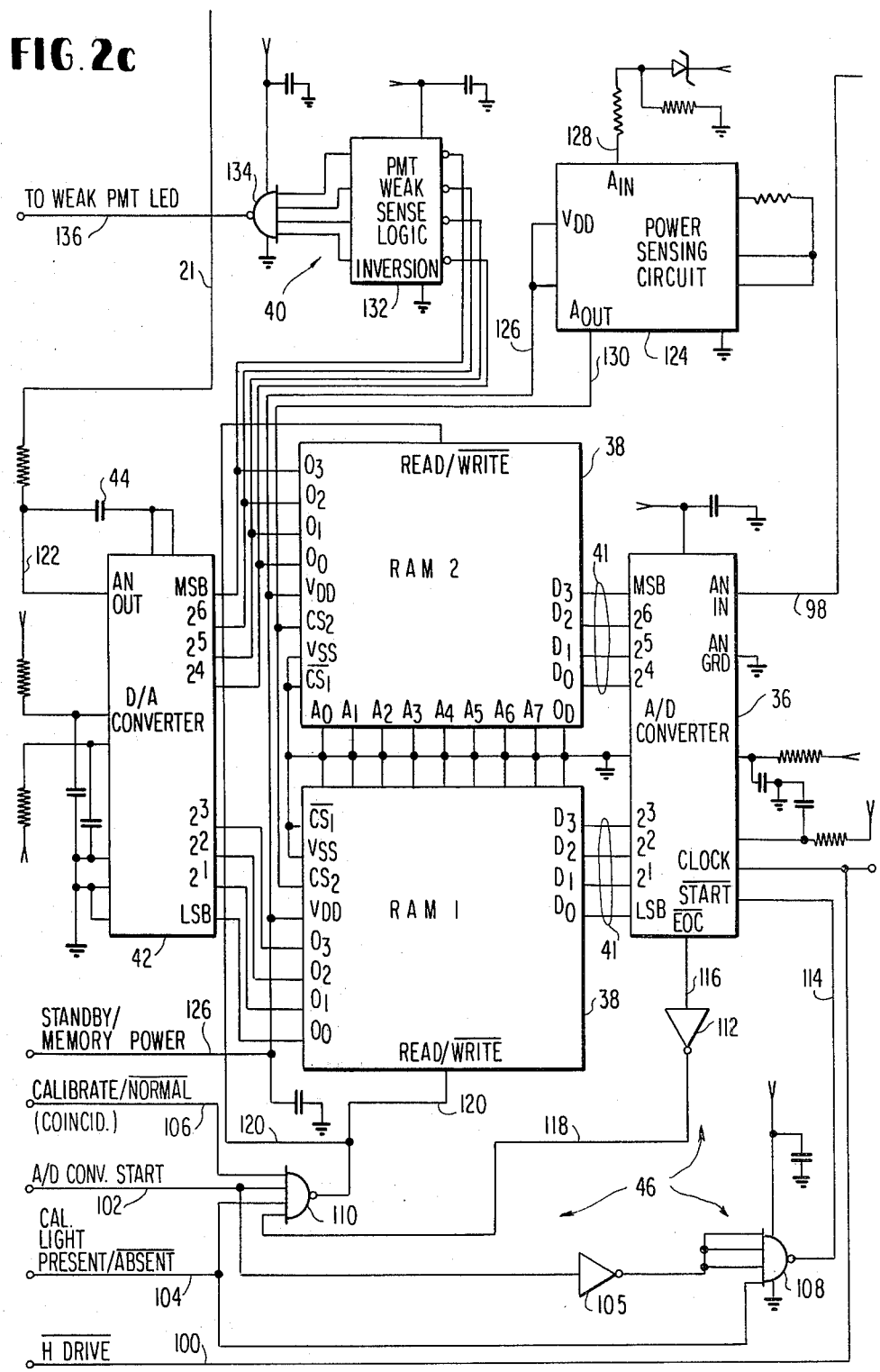

FIGS. 2a, 2b and 2c taken together illustrate a schematic circuit diagram of the components of the preamplifier 10 of FIG. 1, and like reference numerals indicate identical or corresponding parts. The circuit of FIGS. 2a, 2b and 2c comprises the best mode presently contemplated for carrying out the preamplifier of the present invention, although it will be understood by a person of ordinary skill in the art that many different circuit elements, components, and configurations may be combined to produce substantially the same functions in substantially the same way as the preferred embodiment illustrated.

Referring first to FIG. 2a, the anode of photomultiplier tube 12 is directly connected at terminal 62 into an input load resistor 64 at the front end of the preamplifier. This is at ground level, so coupling is directly into the cascode field effect transistor input stage 14 which comprises field effect transistors Q2 and Q3 and transistor Q1 whose emitter is coupled to the junction of the drain electrodes of transistors Q2 and Q3.

The output from cascode stage 14 is fed from the collector of transistor Q1 to the base of transistor Q4 which comprises emitter follower 16. From the emitter of transistor Q4, the signal is fed to the base of transistor Q5 which comprises the high peaking stage 18. Transistor Q5 includes a collector resistor 68 and an emitter resistor 70, the latter being connected in parallel with a variable capacitor 72 and a variable resistor 74.

The function of transistor Q4 is to buffer the load of transistor Q5 away from the collector resistor 66 of transistor Q1. The collector resistor 68 and emitter resistor 70 of transistor Q5 function to enhance the amount of the reactive component across variable capacitor 72 to give less degeneration as the frequency signal increases thereby resulting in greater gain at increased frequencies.

The output from high peaking transistor Q5 is fed from its collector and is alternating current coupled on line 76 into automatic gain control amplifier chip 20. Automatic gain control chip 20 has an internal analog multiplier so that the direct current voltage on line 21 will change the video gain of the signal passing through it and appearing on output line 78. The components 80 are provided for decoupling the power supply, while the (−) input of chip 20 is alterating current grounded.

Moving on to FIG. 2b, the amplifier output signal from chip 20 on line 78 is fed to the base of emitter follower transistor Q6. Q6 acts as a buffer to minimize the load capacity on the collector load resistor 82 of chip 20. The output of transistor Q6 is fed from its emitter into the base of transistor Q7 which forms the gain-of-three peaking stage 24. Transistor Q7 includes an RLC tuned circuit 84 in the peaking network to provide series resonance where the signal peaks the highest. Above that point, for example, 40 megahertz, the signal will be rolled off rapidly to prevent amplification of any unnecessary noise. This roll-off is controlled, however, with circuit-damping to avoid the "ringing" on steep step functions resulting from too fast of a response roll-off.

The output from transistor Q7 is fed from its collector to the base of emitter follower transistor Q8 which serves to present a low impedance source for the direct current restorer 28. Direct current restorer 28 takes the form of a transistor switch Q9 whose collector is connected to the capacitor 86 which couples the output of transistor Q8 into the line driver chip 30. Transistor Q9 places its collector at ground level whenever the video output signal is at zero which occurs, for example, in the normal mode during the horizontal blanking time of the video output. As explained hereinabove, this serves to start each video line at ground, and any video level will be referenced to ground during the time of the succeeding scan line. The time constant of the capacitor 86 is designed to be long enough so as not to charge or discharge within that time period.

In other words, transistor Q9 serves as a gated clamp which is gated on by reception of a $\overline{\text{CLAMP KEY}}$ signal on line 87 which is derived from the logic circuit of FIG. 3, to be described in greater detail hereinafter. When switch Q9 is gated on by the $\overline{\text{CLAMP KEY}}$ signal, the output of transistor Q8 is inhibited from reaching line driver chip 30. When Q9 is gated off by the absence of the $\overline{\text{CLAMP KEY}}$ pulses, the output signal from transistor Q8 is passed into line driver chip 30 to produce the desired video output signal on line 11. In the normal mode, switch Q9 is gated on during horizontal blanking when the video is at ground in order to put a dark reference on the video. During the calibrate mode, such restoration must also be provided, which necessitates a chopped calibrated light source in order to provide periodic dark intervals during which the direct current restoration can take place. The bright intervals of the chopped calibrated light source are used, of course, to calibrate the tube-preamplifier combination.

The output from line driver 30 is fed through a cable matching resistor 77 to a connector for coupling the video output signal to summing amplifier 32 of FIG. 1. The output from line driver 30 is also fed via line 61 through a peak detector circuit 62 which includes diode 88, capacitor 90, and resistors 92 and 94. Peak detector 62, whose operation will be described in greater detail hereinafter, compensates for droop in the calibrating signal caused by certain circuit components of FIG. 2.

The video output signal is fed along line 61 and is balanced against a reference voltage established by diode 96 and resistor 94. If the voltage developed at the junction of resistors 92 and 94 is other than zero, amplifier 34 develops an analog error voltage on its output 98 which is proportional to the difference therebetween.

The error voltage on line 98 is fed to the analog input of an analog-to-digital converter 36 of FIG. 2c, to which attention is now directed. Analog-to-digital converter 36 receives as a clock input the $\overline{\text{H DRIVE}}$ signals along line 100. The $\overline{\text{H DRIVE}}$ signals are developed by the circuitry of FIG. 3, which will be explained in greater detail below. In order to initiate the operation of analog-to-digital converter 36, a low level $\overline{\text{START}}$ signal must be received on input 114 thereof. This $\overline{\text{START}}$ signal is provided when the inputs of a NAND gate 108 are all at a high logic level. Such condition obtains when the signal on line 102 and the signal on line 104 are both at a logic high. The signal on line 102 comprises an A/D CONVERT START signal and is also developed by the logic circuitry of FIG. 3 in a manner to be explained in greater detail below. The signal on line 102 is inverted twice by line receiver 103 and inverter 105 prior to being fed as three enabling inputs to NAND gate 108. The CALIBRATION LIGHT PRESENT/ABSENT signal on line 104 is intended to provide an indication of whether the chopped calibration light source is in position and lined up with the cluster of photomultiplier tubes and preamplifiers to be gain calibrated. If the calibration reference light is present and lined up with the desired cluster, line 104 is at a logic level high to enable one input of NAND gate 108, whereas if the chopped calibration light source is not in its proper position, a logic low signal is provided on line 104 to inhibit operation of the analog-to-digital converter 36.

Upon receipt of a proper $\overline{\text{START}}$ signal on line 114, the analog-to-digital converter 36 begins converting the analog input on line 98 into an eight-bit digital word. Upon conclusion of this analog-to-digital conversion, an end-of-conversion (EOC) signal is provided on output 116 of analog-to-digital converter 36. This $\overline{\text{EOC}}$ signal is raised to a logic level high by inverter 112 and is fed as one enabling input 118 to NAND gate 110.

The other three inputs to NAND gate 110 include the inverted A/D CONVERT START signal from line receiver 103, the CALIBRATE LIGHT PRESENT/ABSENT signal on line 104, and a COINCIDENCIZED CALIBRATE/NORMAL signal on line 106. The latter signal is also developed by the logic circuitry of FIG. 3 and is in a logic high state during the calibrate mode. Thus, when in the calibrate mode with the calibrate light in proper position, and after the analog-to-digital converter is enabled (which occurs during the bright cycles of the chopped light source) and at the conclusion of conversion, all of the inputs to NAND gate 110 will be high to provide a low level output on lines 120 which triggers the $\overline{\text{WRITE}}$ inputs of digital memory circuits 38. Thus, if the remaining inputs to NAND gate 110 are high, the $\overline{\text{EOC}}$ signal from analog-to-digital converter 36 will serve to write enable the memories 38 which preferably consist of a pair of four-bit random access memories denoted RAM 1 and RAM 2. The analog-to-digital converter 36 will hold the information converted in its registers until given its next $\overline{\text{START}}$ command along line 114, while the memories 38 write in the converted digital information from lines 41 and continues to be open for write-in as long as the analog-to-digital converter 36 holds its previous conversion results. The memories 38 then store what was just written in as the next analog-to-digital start cycle begins at the onset of the next calibrate bright cycle.

The eight-bit output of memories 38, denoted by lines $O_0$, $O_1$, $O_2$ and $O_3$ from both RAM 1 and RAM 2, is displayed continuously either according to what is being written into the memories 38 or what is subsequently stored in memories 38. This eight-bit output from memories 38 is converted back into analog form by digital-to-analog converter 42 which subsequently feeds the analog output on line 122 to the automatic gain control input 21, thereby completing the calibration loop.

The integrator 44 comprises a capacitor which limits the amount of correction possible during each bright cycle to prevent over-correction excursions into the automatic gain control input 21.

The memory circuits 38 are provided with a back-up battery supply and low standby power capability so that if the main power fails or is shut down, the contents of the memories will not be lost. This function is performed by a power sensing circuit 124 which may take the form of a Schmitt trigger gate. When the main preamplifier power on line 128 falls below a predetermined level, circuit 124 provides an output on line 130 to deactivate the chip select ($CS_2$) inputs of RAM 1 and RAM 2 to place same on standby status so that their information will be maintained by a standby power supply which may be provided, for example, by a battery (not shown) coupled to line 126.

The low binary-weight sense logic circuit 40 is provided by circuit components 132 and 134 which are inverting and decoding elements, respectively, to provide an output indication on line 136 when the photomultiplier tube being calibrated is deemed to be weak and replacement is needed. Such a condition is indicated when too much correction is required for a particular photomultiplier tube-preamplifier in order to get the required gain of the combination up to calibration level. Functionally, the logic circuit 132, which may consist simply of four logic inverters, senses the four most significant bits of the memory output word from RAM 2. The inverted bits are decoded by NAND gate 134 and, if all inputs are high, a low output on line 136 will act to light up an indicator lamp or light-emitting diode on a central status panel. If this occurs during calibration, it serves as a warning to replace the photomultiplier tube of the particular tube-preamplifier undergoing calibration.

Control And Synchronization Logic Circuit

Figure 3A:
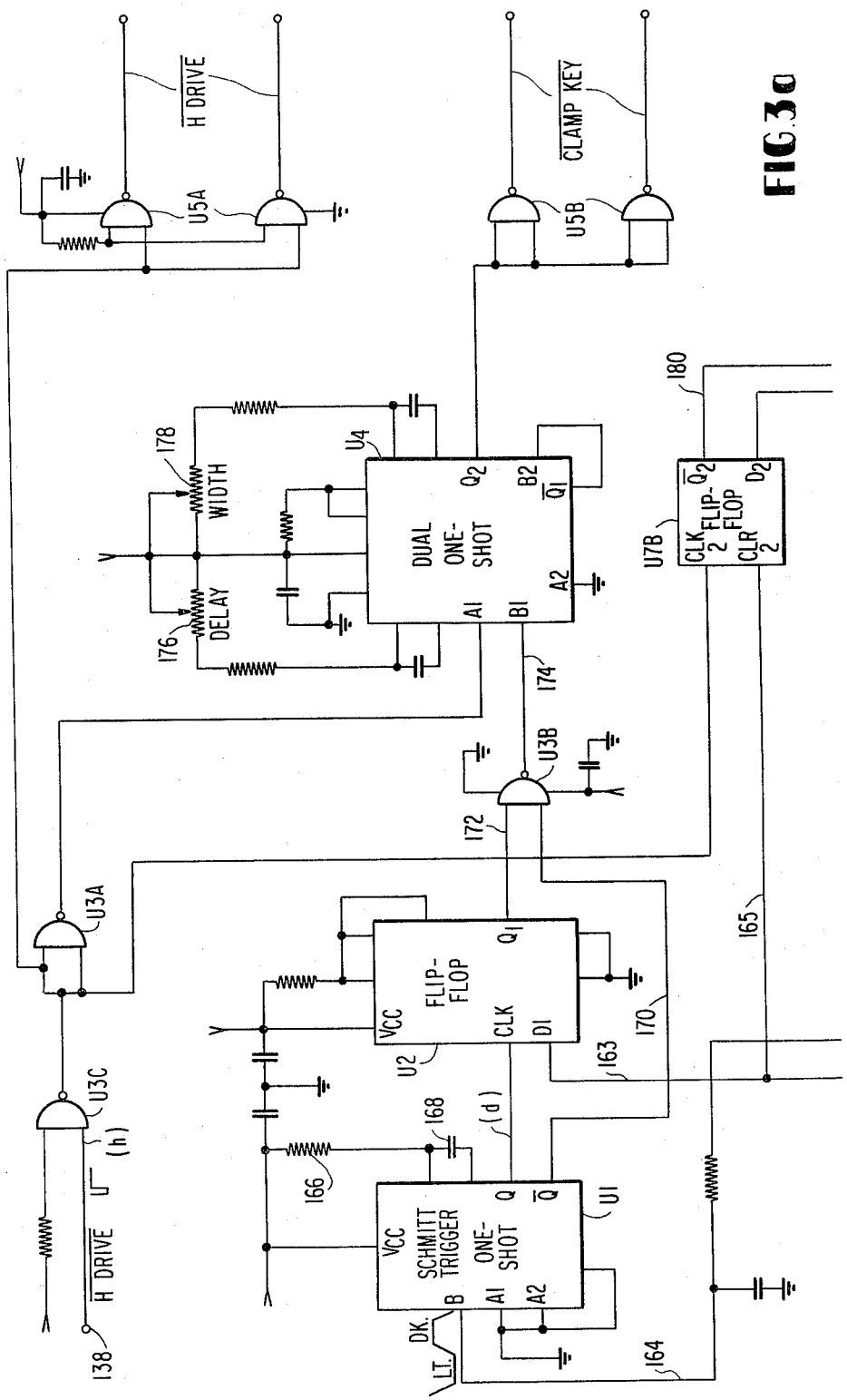
FIGS. 3a and 3b are schematic diagrams which together illustrate a preferred embodiment of the control and synchronization logic circuitry of FIG. 1.
Figure 3B:
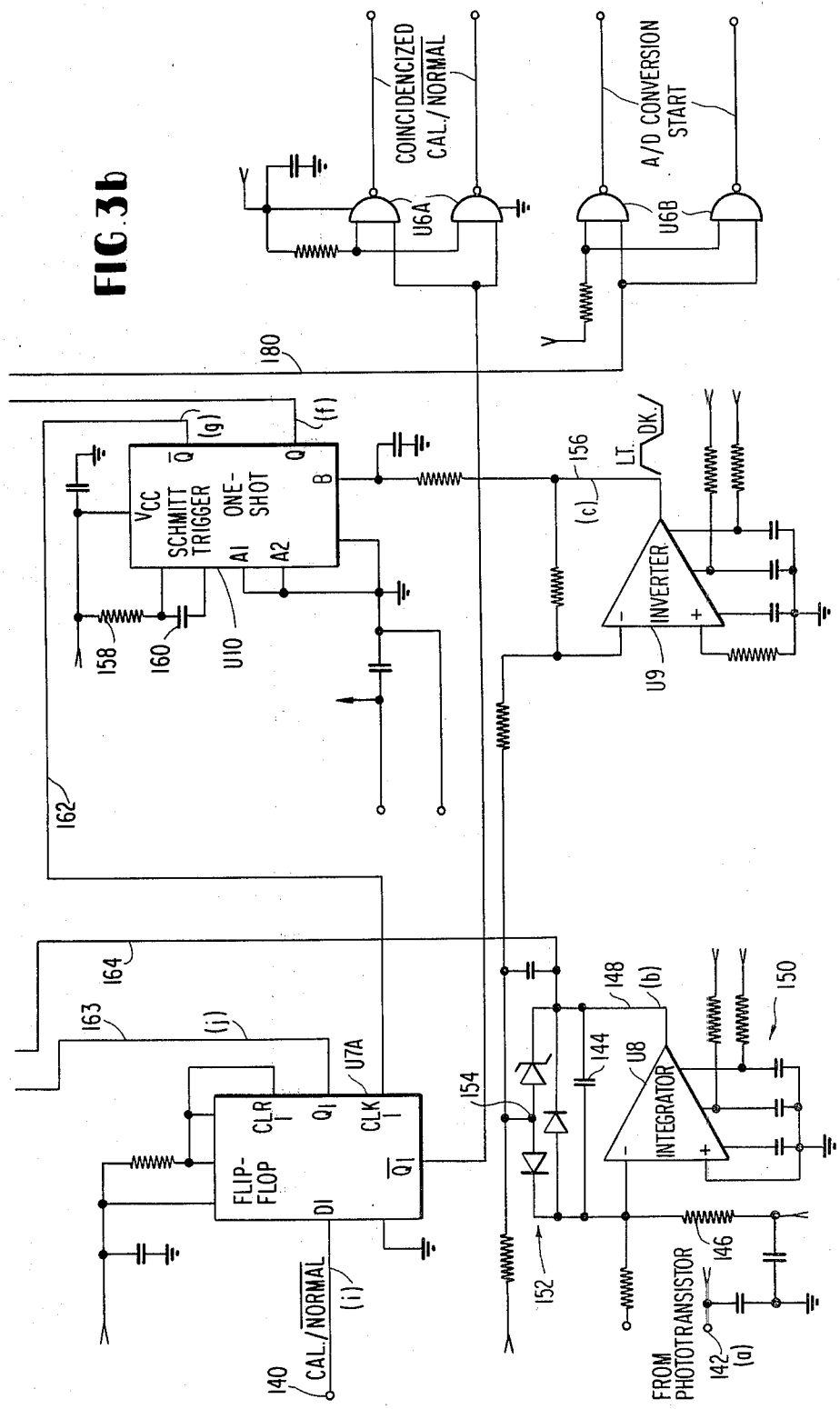

FIGS. 3a and 3b taken together illustrate a preferred embodiment of logic circuit components utilized to generate the various control signals for the preamplifier of FIG. 2, as well as for any of the other preamplifiers with which the calibration system is desired to be utilized. In other words, the output signals from the circuit of FIG. 3 are common to as many photomultiplier tube-preamplifier combinations as may be in the system.

The output signals derived from the circuitry of FIG. 3 are labeled along the righthand side thereof and include the $\overline{\text{H DRIVE}}$ signal (which is received on line 100 of FIG. 2), the $\overline{\text{CLAMP KEY}}$ signal (which is received on line 87 of FIG. 2), the COINCIDENCIZED CALIBRATE/NORMAL signal (which is received along line 106 of FIG. 2), and the A/D CONVERT START signal (which is received on line 102 of FIG. 2). Each of these output signals may be provided on one or more output lines (two output lines for each signal are shown) for transmission to different preamplifier clusters in the system.

As explained above, the $\overline{\text{H DRIVE}}$ signal, in addition to providing synchronization for the operation of the circuit of FIG. 3, is utilized as the clock input for the analog-to-digital converter 36 of FIG. 2, while the $\overline{\text{CLAMP KEY}}$ signal is utilized to enable the direct current restorer 28 to provide a dark video reference (both during the normal mode and the calibrate mode). The COINCIDENCIZED CALIBRATE/NORMAL signal is utilized so that the memory will not be updated during the normal mode, while the A/D CONVERT START signal is utilized to initiate conversion of the analog error voltage into digital form during a calibrate bright cycle.

The circuitry of FIG. 3 has three input signals which are respectively applied at terminals 138, 140 and 142. Terminal 138 receives $\overline{\text{H DRIVE}}$ pulses from the sync generator of the video display system which have a period of, for example, approximately 32.58 microseconds. These negative-going pulses are applied from terminal 138 through a pair of buffers U3C and U3A which are NAND gates connected to operate as inverters. The output from gate U3C is fed as a clock input to a D-type flip-flop U7B, and is also fed directly to output buffers U5A to provide the $\overline{\text{H DRIVE}}$ signal to line 100. The output of gate U3A is applied to the input of a dual one-shot circuit U4. One-shot U4 basically comprises the clamp key shaper circuit 58 of FIG. 1 and serves to reshape and delay the H DRIVE pulses, in a manner to be explained in greater detail hereinafter, to provide the $\overline{\text{CLAMP KEY}}$ pulses on its Q2 output.

Terminal 140 is supplied with a CALIBRATE/NORMAL signal which may be generated by, for example, a mechanical switch which is actuated in any suitable fashion to provide a high level input at terminal 140 when the calibrate mode is desired for preamplifier 10. Likewise, a low level input to terminal 140 is provided during normal preamplifier operation.

Terminal 142 is supplied with a signal that represents the output of the chopped calibrated light source (not shown). Typically, a calibration lamp is provided which outputs a predetermined level of light. An eight-section chopping disc is placed in front of the light source and is run by a synchronous alternating current motor at, for example, 3,600 revolutions per minute. This would provide a calibration lamp chopping cycle of approximately 2 milliseconds long, one millisecond of which is full brightness, the other millisecond of which is full darkness. The bright cycle and dark cycle outputs of the chopped light source are directed onto the photomultiplier tube being calibrated. The transition from bright-to-dark and back again is also sensed, for example, by a phototransistor (not shown) whose output is applied to terminal 142. The remainder of the circuitry of FIG. 3 is directed towards sensing when the chopped light source is in a bright cycle or a dark cycle so that the proper functions may be performed within each cycle. That is, the calibration obviously can only be achieved during a full bright cycle, and thus the operation of the analog-to-digital converter and associated circuitry must all occur within a one millisecond interval. Likewise, the $\overline{\text{CLAMP KEY}}$ input to the direct current restorer can only be provided during a full dark cycle. The circuitry of FIG. 3 develops a full bright pulse and a full dark pulse which control the generation of the various signals so as to fall within the respective pulse widths.

Figure 4:
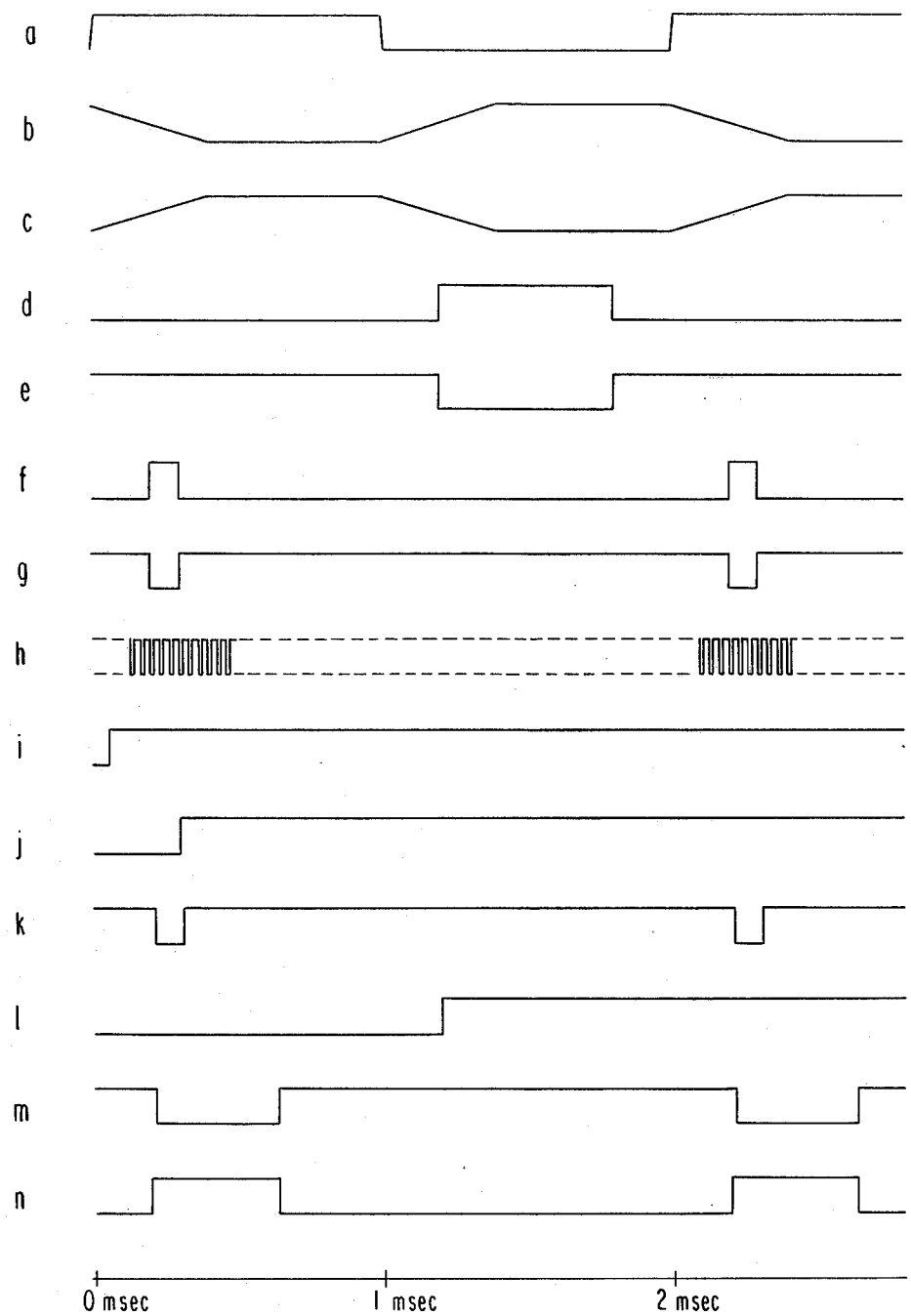
FIG. 4 is a timing diagram showing a number of waveforms helpful in understanding the operation of the preferred embodiments illustrated in FIGS. 1–3.

The operation of the circuit of FIG. 3 will now be explained with the assistance of FIG. 4 which is a timing diagram illustrating several of the waveforms generated at various points in the circuit. For example, waveform (a) of FIG. 4 represents the output of the phototransistor as applied to terminal 142 of FIG. 3 wherein the upper level of the waveform corresponds to a bright cycle, while the lower level of the waveform corresponds to a dark cycle. Waveform (a) is very similar to the waveform which would be output by the photomultiplier tube undergoing calibration.

This waveform is applied via terminal 142 to the inverting input of an integrator U8 wherein capacitor 144 and resistor 146 establish a slope as the output of the phototransistor shifts from dark to bright and vice versa. The output waveform from integrator U8 that appears on line 148 is is illustrated in FIG. 4 as waveform (b) and it may be appreciated that there is an approximate 400 microsecond delay slope during transitions from each dark cycle to each bright cycle and vice versa. The delay is helpful in shifting the triggering of the yet-to-be-generated full bright pulse and full dark pulse from aperture effects which occur when the shutter passes the lamp aperture.

Capacitors 150 coupled to integrator U8 are provided for power supply decoupling and stablizing.

The output on line 148 is fed to a diode network 152 which serve as limiters to fix the limits of total transistor logic (TTL) levels. From junction 154 of diode network 152, the output signal is picked off and fed to the inverting input of an inverter U9 which produces at its output 156 an inverted version at the proper logic levels of the signal appearing on line 148. Waveform (c) of FIG. 4 indicates the shape of the waveform appearing on line 156 which is an inverted version of waveform (b). Waveform (c) also experiences a delay of about 400 microseconds when rising from zero to approximately 3.3 volts when the transition is from a dark cycle to a bright cycle, and also experiences a similar delay from 3.3 volts down to zero volts when the transition of waveform (a) is from a bright cycle to a dark cycle.

Waveform (c) on line 156 is fed to the input of a Schmitt trigger one-shot circuit U10. The Schmitt trigger is set to initiate the one-shot when the slope of the input waveform rises to approximately 1.5 volts, or about halfway up the slope of waveform (c). Resistor 158 and capacitor 160 set the pulse width for the one-shot output to be, for example, approximately 100 microseconds an output Q, which pulse is represented in FIG. 4 by waveform (f) and which comprises the desired bright pulse that falls fully within the bright portion of the chopped calibrated light cycle. This bright pulse is fed as the data input D2 to a flip-flop U7B for a purpose which will be described hereinafter, while the inverted form of the bright pulse, illustrated in FIG. 4 as waveform (g), is fed along line 162 from one-shot U10 as the clock input to flip-flop U7A.

Meanwhile, waveform (b) is also fed from integrator U8 to input 164 of another Schmitt trigger one-shot circuit U1. The Schmitt trigger of this circuit is also designed to trigger approximately halfway up the positive going slope of waveform (b) and the one-shot timing elements 166 and 168 are selected to provide an output pulse width on the Q output of U1 which may be, for example, 600 microseconds long, as illustrated by waveform (d) of FIG. 4. As may be appreciated from FIG. 4, waveform (d) represents the desired dark pulse which falls within the full dark time of the chopped calibrated light source. This full dark signal is fed as the clock input to a flip-flop U2, and the inverse waveform from the $\overline{Q}$ output of U1 (see waveform (e) of FIG. 4) is fed along output line 170 as one input to a NAND gate U3B.

Waveform (h) of FIG. 4 represents the $\overline{\text{H DRIVE}}$ pulses which are utilized in a manner previously explained.

In operation, assume that the $\overline{\text{CALIBRATE/NORMAL}}$ signal at terminal 140 goes high indicating a switch to the calibrate mode. This is represented in FIG. 4 by waveform (i) which is fed as the D1 or data input to flip-flop U7A. After the input D1 of U7A goes high, the output Q1 will go high upon receipt of the next positive going clock pulse. The clock pulse to flip-flop U7A is received along line 162 as waveform (g) which is the inverse of the 100 microsecond bright pulse. Thus, the output Q1 of flip-flop U7A goes high on the trailing edge of waveform (g). This Q1 output is indicated in FIG. 4 by waveform (j) and is fed as the data input D1 to flip-flop U2 on line 163 and as a clear input to flip-flop U7B on line 165.

The $\overline{Q1}$ output of U7A is fed to output buffers U6A for reinversion and delivery to the circuitry of FIG. 2 as the COINCIDENCIZED CALIBRATE/$\overline{\text{NORMAL}}$ signal, wherein coincidence is achieved between the switching from the normal mode to the calibrate mode and the outset of the bright cycle pulses. This is achieved by clocking flip-flop U7A with the inverted bright pulse (waveform (g)).

Flip-flop U2 receives as its data input D1 waveform (j) from the Q1 output of flip-flop U7A. As its clock signal, flip-flop U2 receives waveform (d) from the Q output of U1, so that the Q1 output of flip-flop U2, indicated by waveform (l) of FIG. 4, will not go high until the first dark cycle, after the coincidencized command to CALIBRATE. From this moment on, assuming that the system remains in the calibrate mode, the input 172 to NAND gate U3B will remain high. The other input to NAND gate U3B comprises waveform (e) which appears on line 170 from the $\overline{Q}$ output of circuit U1. Thus, the output of NAND gate U3B on line 174, which is applied to the B1 input of dual one-shot U4, is high on the calibrate mode only during full dark cycles. When waveform (e) is high (which occurs during the time period outside the full dark pulse), the output 174 of U3B will be low, which will inhibit the Q2 output of dual one-shot U4, thereby effectively inhibiting generation of the $\overline{\text{CLAMP KEY}}$ signals during the bright cycles. The $\overline{\text{H DRIVE}}$ pulses received on input A1 to chip U4 are reshaped, delayed and output at Q2 when B1 is enabled to provide $\overline{\text{CLAMP KEY}}$ pulses during the dark cycles. The delay and width of the $\overline{\text{CLAMP KEY}}$ pulses are adjustably shaped by the potentiometers 176 and 178.

Flip-flop U7B comprises the H SYNC COINCIDENCE circuit 54 of FIG. 1 and receives waveform (f) as its D2 data from the Q output of U10 and as its clocking input receives inverted $\overline{\text{H DRIVE}}$ pulses from gate U3C. Thus, flip-flop U7B delivers on its $\overline{\text{Q2}}$ output a waveform which is triggered on the next positive going clock pulse after inception of the full bright pulse at data input D2. The $\overline{\text{Q2}}$ output on line 180 is indicated in FIG. 4 by waveform (k) which is fed to and inverted by buffers U6B to create the A/D CONVERT START signal that is fed to line 102 of the circuit of FIG. 2. The purpose of flip-flop U7B, therefore, is to make the A/D CONVERT START signal synchronous with the $\overline{\text{H DRIVE}}$ signal which is also used, as will be recalled, as the clock signal to the analog-to-digital converter 36. Thus, by also using the $\overline{\text{H DRIVE}}$ signal as the clock input to flip-flop U7B, the start of conversion is made synchronous with the clock.

The output of inverter 112 of FIG. 2 is represented by waveform (m) of FIG. 4 wherein the positive-going transitions indicate the end of conversion. The output of gate 110 of FIG. 2 is represented by waveform (n) wherein the high levels indicate data storage. It may be appreciated from waveforms (m) and (n) that the memories 38 store the previous result during conversion, and at the conclusion of the analog-to-digital conversion in progress, the memories are write-enabled.

If the signal at terminal 140 of FIG. 3 is switched from the calibrate mode to the normal mode, the output Q1 of flip-flop U7A will go low to clear the U7B flip-flop so as to provide a high output on line 180 which is equivalent to a low output from buffers U6B and therefore the absence of an A/D CONVERT START signal. Thus, analog-to-digital conversion cannot commence in the normal mode, and the automatic gain control loop remains open.

In the normal mode, the low level of output Q1 of flip-flop U7A is also fed to the data input D1 of flip-flop U2. After the next positive going transition on the clock input of U2, its output Q1 also goes low which provides a low level logic signal along line 172 to NAND gate U3B. This low level logic on line 172 during normal operation always provides a high output on line 174 regardless of the logic level of input 170, and therefore provides a continuous enable on input B1 of one-shot U4 to continuously form $\overline{\text{CLAMP KEY}}$ pulses during horizontal blanking, which is required in normal operation.

Referring back to FIG. 2, it may now be appreciated that peak detector 62 is provided to resolve a difficulty in droop in the one millisecond calibrating bright signal which results from a limited coupling time constant to the input of amplifier 20 as well as 30-droop caused by $I_{co}$ of transistor Q9 in the direct current restorer 28. The total droop at the output 11 of line driver 30 is appreciable enough to cause a change of analog level during the analog-to-digital conversion period. This change in analog level could create an error worth several bits of digital value. To alleviate this problem, peak detector 62 is provided which comprises a Schottky diode 88, a storage capacitor 90, and the input sense/reference divider load resistors 92 and 94. The peak detector 62 charges the capacitor 90 to the initial value of the calibrating sense signal and is held there for the remainder of the calibrating bright cycle. The diode 88 thus isolates the drooping portion from the peak-charged value. The time constant of peak detector 62 is long enough so that less than one bit of level change occurs over the analog-to-digital conversion period, but is short enough so as to easily follow gain-drift changes within the photomultiplier tube and the preamplifier, for which the automatic gain control loop is correcting.

It may be appreciated from the foregoing the automatic gain control correction loop is broken into analog-to-digital, digital operation, and digital-to-analog. The reason for these conversions is the fact that calibration can take place, for example, once a day, and that normal video is very inconsistent as far as highlight level is concerned. This inconsistency of highlight video requires a separate calibration-automatic gain control cycle incorporating the chopped calibration light source. Since this is done once a day, for example, the automatic gain control loop is active only at that time. The final automatic gain control voltage stablized upon must be remembered for the rest of the day, when normal preamplifier operation is in effect, so that the tube-preamplifier remains at the fixed calibrated gain. As stated above, the calibration light source is chopped so that the direct current restorer 28 can be operated during the calibrate mode as well as during the normal mode which corresponds to normal laser scanning. One reason the automatic gain control loop converts the information from analog to digital and then to analog again is the requirement that the information be remembered for a period as long as a day, since analog memories that hold level information for such time periods are most impractical. The random access memories 38 enable data to be readily changed during calibration, and passes such changing data in state through its outputs when in a write-in function. The automatic gain control input is thus held at a constant level corresponding to that which gave the correct gain for the particular tube-preamplifier to get a predetermined level of video (for example, 2 volts) from the system under calibrated light conditions. This value will be held in memory until the next calibration readiness is performed.

Obviously, numerous modifications and variations of the present invention are possible in light of the above teachings. For example, instead of utilizing one memory system per preamplifier, a central processor connected to each preamplifier could be utilized. This would involve a computer and associated software. Therefore, we wish it to be understood that within the scope of the appended claims, the invention may be practiced otherwise than as specifically described herein.

We claim as our invention:

1. A calibration circuit for a preamplifier connected to amplify the output from a photomultiplier tube or the like, which comprises:
   automatic gain control circuit means for receiving said output of said tube;

a calibrated source of light for directing a predetermined level of light onto said tube during a calibration mode thereof;

means for comparing the output of said preamplifier during said calibration move with a predetermined voltage level and for generating an error voltage proportional to the difference therebetween, wherein said predetermined voltage level represents the response of a properly calibrated tube to said predetermined level of light; and means for periodically storing said error voltage and for feeding same to said automatic gain control circuit means for adjusting the gain thereof.

2. A calibration circuit as set forth in claim 1, further comprising:

analog-to-digital means connected to receive the output from said comparing and generating means for converting said error voltage into digital form;

said means for storing said error voltage connected to receive the output from said analog-to-digital means and comprising digital memory means; and digital-to-analog means connected to receive the output from said digital memory means for converting said digital form of said error voltage into analog form which is connected to a control input of said automatic gain control circuit means in said preamplifier for adjusting the gain thereof.

3. A calibration circuit as set forth in claim 2, further comprising means connected to receive the output from said digital memory means for indicating when said error voltage exceeds a predetermined level whereby replacement of said tube may be indicated.

4. A calibration circuit as set forth in claim 2, further comprising means responsive to the conclusion of operation of said analog-to-digital means for enabling said digital memory means to receive and store said digital form of said error voltage.

5. A calibration circuit as set forth in claim 2, further comprising standby battery means for maintaining the contents of said digital memory means upon interruption of the main power supply thereto.

6. A calibration circuit as set forth in claim 2, further comprising integrator means connected to the output of said digital-to-analog means for limiting the amount of gain correction to said automatic gain control during said calibration mode.

7. A calibration circuit as set forth in claim 1, wherein said preamplifier includes means operable during a normal mode for restoring a direct current level to the video output of said preamplifier during horizontal blanking of the video system, said restoring means being triggered by means for generating a clamp key signal in response to the horizontal drive signal of said video system.

8. A calibration circuit as set forth in claim 7, further comprising means for chopping said calibrated source of light prior to impingement upon said tube for establishing a bright cycle and a dark cycle on said tube during said calibration mode.

9. A calibration circuit as set forth in claim 8, wherein said means for generating a clamp key signal is also responsive to said horizontal drive signal during said dark cycle in said calibration mode for enabling said direct current level restoring means.

10. A calibration circuit as set forth in claim 9, further comprising means for inhibiting said clamp key signal during said bright cycle in said calibration mode.

11. A calibration circuit as set forth in claim 10, wherein said means for inhibiting said clamp key signal includes:

integrator means responsive to said chopped calibrated source of light for developing a waveform having alternating portions corresponding to said bright cycles and said dark cycles;

first one-shot means responsive to the transition from said dark cycle to said bright cycle of said waveform for generating a bright pulse that falls solely within said bright cycle;

second one-shot means responsive to the transition from said bright cycle to said dark cycle of said waveform for generating a dark pulse that falls solely within said dark cycle;

first bistable means responsive to a transition from said normal mode to said calibrate mode and to the conclusion of said bright pulse for generating a first enabling output signal;

second bistable means responsive to said first enabling output signal and the initiation of said dark pulse for providing a second enabling output signal;

gate means responsive to said second enabling output signal and said dark pulse for providing a third enabling output signal; and clamp key shaping and generating means responsive to said horizontal drive signal and said third enabling output signal for generating said clamp key signal only during said dark cycle.

12. A calibration circuit as set forth in claim 11, further comprising:

analog-to-digital means connected to receive the output from said comparing and generating means for converting said error voltage into digital form;

said means for storing said error voltage connected to receive the output from said analog-to-digital means and comprising digital memory means; and digital-to-analog means connected to receive the output from said digital memory means for converting said digital form of said error voltage into analog form which is connected to a control input of said automatic gain control circuit means in said preamplifier for adjusting the gain thereof.

13. A calibration circuit as set forth in claim 12, wherein said analog-to-digital means is responsive to means for generating in said calibration mode an analog-to-digital conversion start signal for initiating the conversion of said error voltage into digital form.

14. A calibration circuit as set forth in claim 13, wherein said means for generating an analog-to-digital conversion start signal comprises:

third bistable means responsive to receipt of said bright pulse and said horizontal drive pulse for providing said analog-to-digital conversion start signal which terminates within said bright cycle.

15. A calibration circuit as set forth in claim 14, wherein said third bistable means is also responsive to the absence of said first enabling output signal from said first bistable means for inhibiting the generation of said analog-to-digital conversion start signal.

16. A method of calibrating a preamplifier connected to receive the output of a light detector, said preamplifier including an automatic gain control circuit whose gain is adjusted by an analog control voltage, which comprises the steps of:

directing a chopped source of calibrated light onto said detector in a calibrate mode to create alternating bright cycles and dark cycles;

comparing the output voltage of said preamplifier during one of said bright cycles with a predetermined voltage level and generating an error voltage in proportion to the difference therebetween; and developing said analog control voltage in response to said error voltage for adjusting the gain of said automatic gain control circuit.

17. A preamplifier calibrating method as set forth in claim 16, wherein said step of developing said analog control voltage includes the steps of:
converting said error voltage into a digital signal;
storing said digital signal in a memory at the conclusion of the preceding step; and
converting said stored digital signal into said analog control voltage.

18. A preamplifier calibrating method as set forth in claim 16, further comprising the step of restoring a direct current voltage level to the output of said preamplifier during said dark cycles.

19. A preamplifier connected to receive the video output signal of a light detector in a video imaging system, which comprises:
automatic gain control circuit means for amplifying said video output signal in accordance with an analog control signal received by said automatic gain control circuit means; and
means operative in a calibrate mode for generating and storing a digital signal proportional to said analog control signal in response to a predetermined level of light impinging on said detector from a calibrated source, and a comparison of the video output signal with a predetermined voltage level.

20. The preamplifier as set forth in claim 19, further including means operative during a normal mode and during said calibrate mode for periodically restoring a direct current level to the output signal of said preamplifier in response to a clamp key signal.

21. The preamplifier as set forth in claim 20, further comprising means for chopping said calibrated source of light prior to impinging on said detector for providing alternating bright cycles and dark cycles of video output, said generating and storing means being enabled only during said bright cycles.

22. The preamplifier as set forth in claim 21, further comprising means for generating said clamp key signal during horizontal blanking of said video system in said normal mode and during said dark cycles in said calibrate mode.

23. The preamplifier as set forth in claim 19, wherein said means operative in a calibrate mode comprises:
means for sensing the output of said detector in response to said calibrated source of light;
means for comparing said output of said detector with a predetermined reference voltage;
means for providing an analog error voltage proportional to the output of said comparing means;
means for converting said analog error voltage into a digital signal;
means for storing said digital signal in a memory; and
means for converting said stored digital signal into said analog control signal for feeding to said automatic gain control circuit means.

24. A video system, which comprises:
a plurality of light detectors;
a plurality of preamplifiers operable in either a normal mode or a calibrate mode and connected respectively to receive the outputs from said plurality of detectors;
a plurality of means associated respectively with said plurality of preamplifiers for individually calibrating the gain thereof during said calibrate mode in response to a predetermined level of light impinging on said plurality of detectors from a calibrated source and a comparison of the outputs from the detectors with a predetermined voltage level; and
control means for synchronizing the operation of said plurality of individual gain calibrating means with said video system.

25. The system as set forth in claim 24, wherein each of said preamplifiers includes automatic gain control circuit means responsive to an analog control voltage for adjusting the gain thereof, and each of said gain calibrating means include means for generating said analog control voltage in response to a predetermined level of light directed onto its associated detector.

26. The system as set forth in claim 25, wherein each of said gain calibrating means further comprises:
means for comparing the output of its associated detector in response to said predetermined level of light with a preset reference voltage and for generating an error voltage proportional to the difference therebetween; and
means for storing said error voltage.

27. The system as set forth in claim 26, wherein each of said gain calibrating means further comprises:
means connected to receive said error voltage from said comparing means and for converting said error voltage into a digital signal;
means for transferring said digital signal to said storing means; and
means for converting said digital signal in said storing means into said analog control signal for said automatic gain control circuit means.

28. The system as set forth in claim 25, wherein said control means comprises:
a chopped light source directed onto said plurality of detectors during said calibrate mode; and
means for sensing the output of said light source to provide an indication of the bright cycles and dark cycles thereof.

29. The system as set forth in claim 28, wherein said control means further comprises:
means for detecting when said preamplifiers are in said normal mode or said calibrate mode; and
means for synchronizing said sensing means and said detecting means with the horizontal drive pulses of the video system.

30. The system as set forth in claim 29, wherein said control means further comprises:
means responsive to said synchronizing means for restoring the direct current level of the output signals from said preamplifiers during horizontal blanking while in said normal mode and during said dark cycles while in said calibrate mode; and
means further responsive to said synchronizing means for initiating the generation of said analog control voltage during said bright cycles.

* * * * *